United States Patent
Park et al.

(10) Patent No.: US 7,889,546 B2
(45) Date of Patent: Feb. 15, 2011

(54) PHASE-CHANGE RANDOM ACCESS MEMORY DEVICE, SYSTEM HAVING THE SAME, AND ASSOCIATED METHODS

(75) Inventors: Joon-min Park, Seoul (KR); Young-kug Moon, Suwon-si (KR); Won-seok Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 181 days.

(21) Appl. No.: 12/285,656

(22) Filed: Oct. 10, 2008

(65) Prior Publication Data

US 2009/0097306 A1    Apr. 16, 2009

(30) Foreign Application Priority Data

Oct. 12, 2007 (KR) .................. 10-2007-0103173

(51) Int. Cl.
*G11C 11/00*    (2006.01)
(52) U.S. Cl. .................. 365/163; 365/230.06; 365/204; 365/185.25
(58) Field of Classification Search .................. 365/163, 365/230.06, 204, 185.25
See application file for complete search history.

(56) References Cited

U.S. PATENT DOCUMENTS

| | | | |
|---|---|---|---|
| 6,909,656 B2 | 6/2005 | Moore et al. | |
| 7,120,054 B2 * | 10/2006 | Abedifard et al. | 365/185.13 |
| 7,352,645 B2 * | 4/2008 | Sforzin et al. | 365/227 |
| 7,512,032 B2 * | 3/2009 | Martinelli et al. | 365/230.06 |
| 7,633,100 B2 * | 12/2009 | Cho et al. | 257/256 |
| 2006/0239109 A1 * | 10/2006 | Nakaya et al. | 365/230.06 |
| 2006/0291277 A1 | 12/2006 | Cho et al. | |
| 2007/0034908 A1 | 2/2007 | Cho et al. | |

FOREIGN PATENT DOCUMENTS

KR    10-2006-0134308 A    12/2006
KR    10-2007-0018583 A    2/2007

* cited by examiner

*Primary Examiner*—Connie C Yoha
(74) *Attorney, Agent, or Firm*—Lee & Morse, P.C.

(57) ABSTRACT

A phase-change random access memory (PRAM) device includes a PRAM cell array including a first sector and a second sector, a first global bit line coupled to a first local bit line of the first sector and a first local bit line of the second sector, and a first plurality of global bit line discharge units coupled to the first global bit line, the first plurality of global bit line discharge units configured to discharge the first global bit line in response to a first global discharge signal.

15 Claims, 10 Drawing Sheets

PHASE-CHANGE RANDOM ACCESS MEMORY DEVICE, SYSTEM HAVING THE SAME, AND ASSOCIATED METHODS

BACKGROUND

1. Technical Field

Embodiments relate to a phase-change random access memory device, a system having the same, and associated methods.

2. Description of the Related Art

FIG. 1 illustrates an equivalent circuit diagram of a unit cell of a phase-change random access memory (PRAM) device that includes a phase-change material GST. Referring to FIG. 1, the unit cell C may include a memory device ME and a P-N diode D. A bit line BL may be connected to the phase-change material GST, which may be connected to a P-junction of the diode D. A word line WL may be connected to an N-junction of the diode D. In another circuit (not shown), the PRAM device may include a transistor connected to the phase-change material GST instead of the diode D.

In the PRAM device, current supplied to the bit line BL to perform write and read operations may influence subsequent write and read operations. For example, when an operation of writing data "1" in a first cell connected to a first bit line is performed, a current is supplied to the first bit line. An undesirable voltage may sometimes be present in the first bit line even when the operation of writing data "1" is terminated. Due to this undesirable voltage, a subsequent write operation of the first cell may be inaccurately performed, or the write or read operations of the first cell may be erroneously performed during the write and read operations of another cell.

In order to solve these problems, a process of discharging bit lines connected to cells to be written to, or read from, may be performed before the write and read operations. However, as the capacity of the PRAM device is increased, the bit line may be made longer, and a parasitic resistance and a parasitic capacitance may be increased during the discharge operation. Such a phenomenon not only increases a discharge time required to perform the discharge operation, but also interferes with accurate discharge operations.

SUMMARY

Embodiments are therefore directed to a phase-change random access memory device, a system having the same, and associated methods, which substantially overcome one or more of the problems due to the limitations and disadvantages of the related art.

It is therefore a feature of an embodiment to provide a phase-change random access memory device having a plurality of global bit line discharge units coupled to a global bit line.

It is therefore another feature of an embodiment to provide a phase-change random access memory device having a global bit line discharge unit disposed between sectors of a memory array.

It is therefore another feature of an embodiment to provide a phase-change random access memory device having a plurality of local bit line discharge units coupled to a local bit line.

It is therefore another feature of an embodiment to provide a phase-change random access memory device having a global bit line discharge unit disposed between sub cell arrays of a sector of a memory array.

At least one of the above and other features and advantages may be realized by providing a phase-change random access memory (PRAM) device, including a PRAM cell array including a first sector and a second sector, a first global bit line coupled to a first local bit line of the first sector and a first local bit line of the second sector, and a first plurality of global bit line discharge units coupled to the first global bit line, the first plurality of global bit line discharge units configured to discharge the first global bit line in response to a first global discharge signal.

The PRAM device may further include a second global bit line coupled to a second local bit line of the first sector and a second local bit line of the second sector, and a second plurality of global bit line discharge units coupled to the second global bit line, the second plurality of global bit line discharge units configured to discharge the second global bit line in response to a second global discharge signal.

The first and second sectors may both be disposed between the first and second global bit line discharge units. Each of the first plurality of global bit line discharge units may include a MOS transistor, a gate of the MOS transistor may be controlled by the first global discharge signal, and the MOS transistor may be configured to couple the first global bit line to a ground voltage line in response to the first global discharge signal.

The PRAM device may further include a first global bit line selection unit, the first global bit line selection unit configured to activate the first global bit line in response to a first global selection signal. The first global discharge signal and the first global selection signal may be synchronized. The first global bit line selection unit may include a MOS transistor, and a gate of the MOS transistor may be controlled by the first global selection signal.

The PRAM device may further include a first sub cell array in the first sector, the first sub cell array coupled to the first local bit line of the first sector, and a first local bit line discharge unit coupled to the first local bit line of the first sector, the first local bit line discharge unit configured to discharge the first local bit line of the first sector in response to a first local discharge signal.

The PRAM device may further include a second local discharge unit coupled to the first local bit line of the first sector, the second local discharge unit configured to discharge the first local bit line of the first sector in response to the first local discharge signal, and the first sub cell array may be disposed between the first and second local bit line discharge units.

The PRAM device may further include a second local bit line coupled to the first sub cell array and the first global bit line, and a second local bit line discharge unit coupled to the second local bit line, the second local bit line discharge unit configured to discharge the second local bit line in response to a second local discharge signal.

The first sector may include the first sub cell array and a second sub cell array, a second local bit line of the first sector may be coupled to the second sub cell array and the first global bit line, a second local discharge unit may be coupled to the second local bit line of the first sector, the second local discharge unit configured to discharge the second local bit line of the first sector in response to a second local discharge signal, and the first and second local discharge units may both be disposed between the first and second sub cell arrays.

The PRAM device may further include a first local bit line selection unit, the first local bit line selection unit configured to activate the first local bit line of the first sector in response to a first local selection signal. The PRAM device may further include a second local bit line selection unit, the second local bit line selection unit configured to activate the first local bit line of the first sector in response to the first local selection signal, The first sub cell array may be disposed between the first and second local bit line selection units.

The PRAM device may further include a second local discharge unit coupled to the first local bit line of the first sector, the second local discharge unit configured to discharge the first local bit line of the first sector in response to the first local discharge signal. The first and second local bit line discharge units may be disposed between the first and second local bit line selection units.

At least one of the above and other features and advantages may also be realized by providing a phase-change random access memory (PRAM) device, including a PRAM cell array including first to $m^{th}$ sectors, where m is a positive integer equal to or greater than 2, a plurality of global bit lines connected to the sectors, and respective global bit line discharge units coupled to each of the global bit lines, the global bit line discharge units configured to discharge the respective global bit line in response to a respective global discharge signal. Each of the global bit line discharge units may be disposed between an $x^{th}$ sector and an $(x+1)^{th}$ sector, where x is a positive integer less than m.

The $x^{th}$ sector may be an $m/2^{th}$ sector when m is a multiple of 2, and the $x^{th}$ sector may be a $(m\pm1)/2^{th}$ sector when m is not a multiple of 2.

At least one of the above and other features and advantages may also be realized by providing a phase-change random access memory (PRAM) device, including a PRAM cell array including a plurality of local bit lines, and respective pluralities of local bit line discharge units coupled to each of the local bit lines. Each of the pluralities of local bit line discharge units may be configured to discharge the respective local bit line in response to a respective local discharge signal.

First and second local bit line discharge units may be disposed at respective ends of each local bit line.

At least one of the above and other features and advantages may also be realized by providing a phase-change random access memory (PRAM) device, including a PRAM cell array including first to $m^{th}$ sub cell arrays, where m is a positive integer equal to or greater than 2, a plurality of local bit lines, each local bit line being coupled to a plurality of sub cell arrays, and respective local bit line discharge units coupled to each of the local bit lines, the local bit line discharge units configured to discharge the respective local bit line in response to a local bit line discharge signal. The local bit line discharge units may be disposed between an $x^{th}$ sub cell array and an $(x+1)^{th}$ sub cell array, where x is a positive integer less than m.

The $x^{th}$ sub cell array may be an $m/2^{th}$ sub cell array when m is a multiple of 2, the $x^{th}$ sub cell array may be a $(m\pm1)/2^{th}$ sub cell array when m is not a multiple of 2.

At least one of the above and other features and advantages may also be realized by providing a phase-change random access memory (PRAM) system, including a PRAM cell array, and a memory controller configured to control operations of the memory cell array. The memory cell array may include a first sector and a second sector, a first global bit line may be coupled to a first local bit line of the first sector and a first local bit line of the second sector, a first plurality of global bit line discharge units may be coupled to the first global bit line, the first plurality of global bit line discharge units configured to discharge the first global bit line in response to a first global discharge signal.

At least one of the above and other features and advantages may also be realized by providing a method of operating a memory system having a phase-change random access memory (PRAM) cell array, the method including controlling set and reset states of cells in first and second sectors of the PRAM cell array, sensing the set and reset states of the cells using a global bit line coupled to a first local bit line of the first sector and a second local bit line of the second sector, and using a global discharge signal to control a plurality of global bit line discharge units coupled to the global bit line.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION

Figure 1:
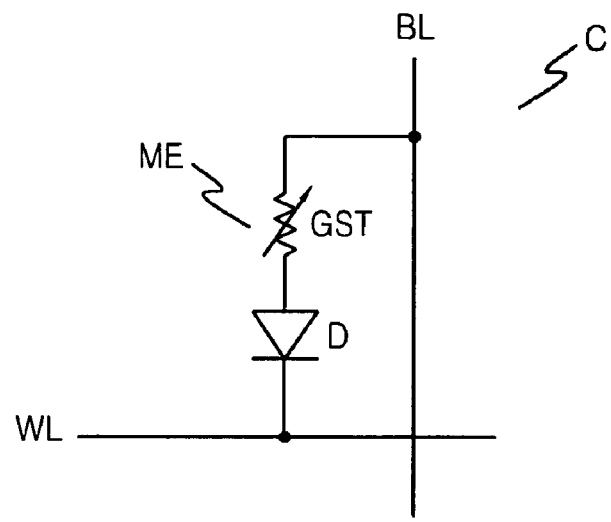
FIG. 1 illustrates an equivalent circuit diagram of a unit cell of a phase-change random access memory (PRAM) device.

Korean Patent Application No. 10-2007-0103173, filed on Oct. 12, 2007, in the Korean Intellectual Property Office, and entitled, "Phase-Change Random Access Memory Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

PRAMs may be used to form non-volatile memories that store data using materials, such as Ge—Sb—Te (GST) (phase-change materials), whose resistances change upon phase transition brought about by a change in temperature. PRAMs may provide non-volatile properties and low power consumption properties, in addition to the advantages of DRAMs.

The phase-change material (Ge—Sb—Te) of a PRAM cell may transform into a crystalline state or an amorphous state, depending on the temperature and duration of heating applied to the phase-change material, thereby storing data in the PRAM cell. In general, a high temperature above 900° C. is required for a phase transition of the phase-change material. Such high temperatures may be obtained by Joule heating caused by current flowing through the PRAM cell.

Figure 2:
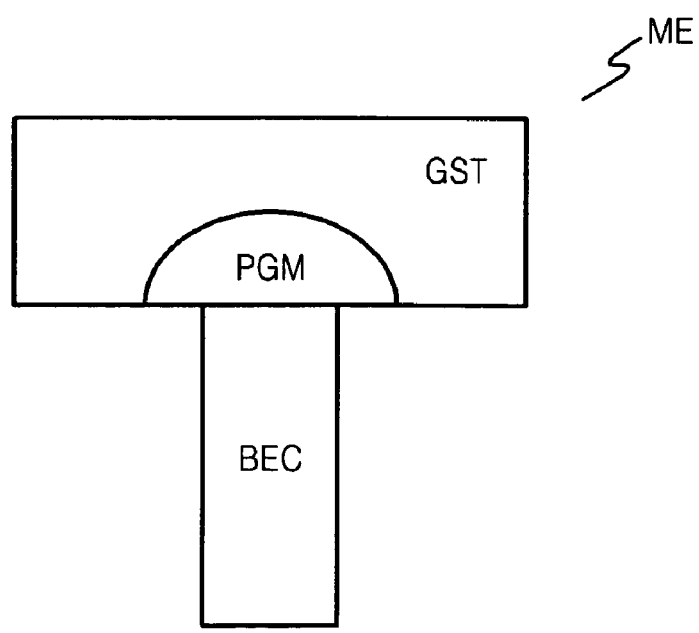
FIG. 2 illustrates a cross-sectional view of a phase-change material in a PRAM device.

FIG. 2 illustrates a cross-sectional view of a phase-change material in a PRAM device. Referring to FIG. 2, PMG represents a contact region between the phase-change material GST and the bottom electrode BEC. If a current is supplied to a bottom electrode contact BEC of the memory device ME, the volume and state of PGM are changed, and the change of PGM determines the crystalline state of the phase-change material GST.

Figure 3:
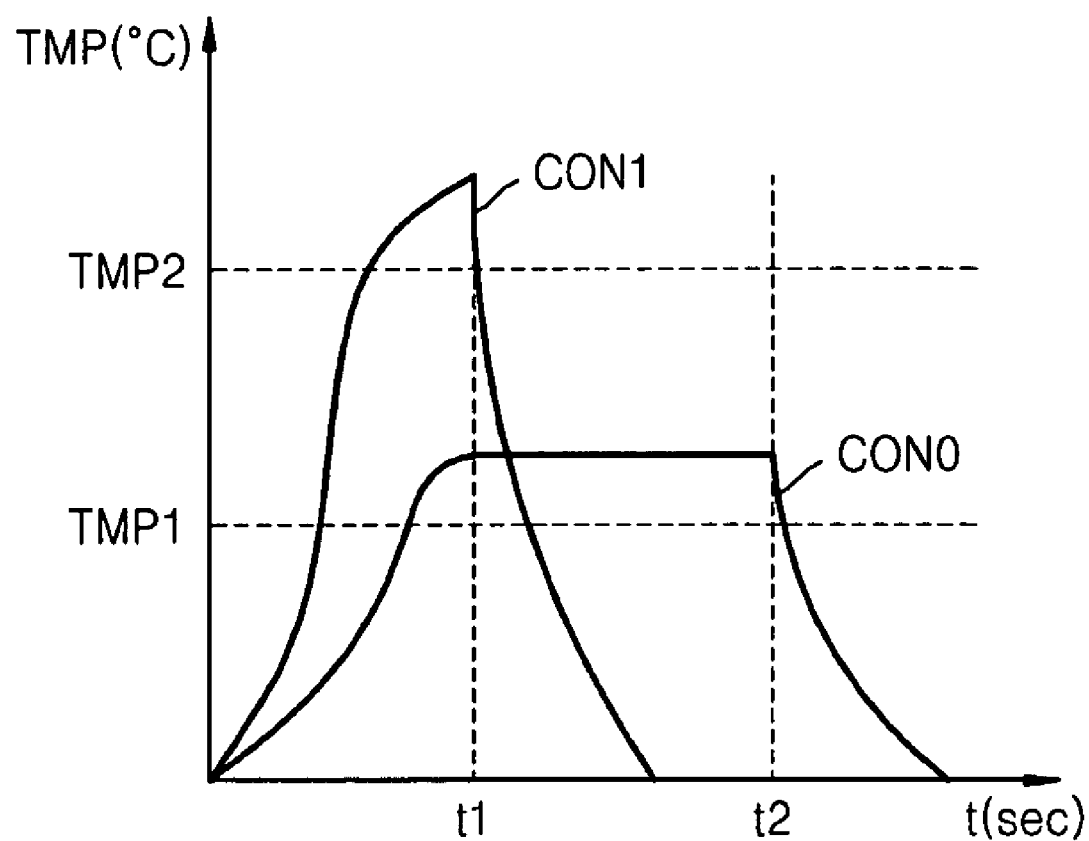
FIG. 3 illustrates a graph of characteristics of the phase-change material of FIG. 2.

FIG. 3 illustrates a graph of characteristics of the phase-change material of FIG. 2. Referring to FIG. 3, "CON1" indicates conditions for changing the phase-change material to an amorphous state, and "CON0" indicates conditions for changing the phase-change material to a crystalline state.

A write operation and a read operation of the PRAM device will be described with reference to FIG. 3. First, a write operation will be described. In order to store data "1", the phase-change material is heated to a temperature above its melting temperature TMP2 (time t1), and then rapidly cooled. Then, the phase-change material GST goes into an amorphous state. Such an amorphous state may be defined as data "1", and may be referred to as a reset state.

In order to store data "0", the phase-change material is heated to a temperature above its crystalline temperature TMP1 for a predetermined period of time (time t2), and gradually cooled. Then, the phase-change material goes into a crystalline state. Such a crystalline state may be defined as data "0", and may be referred to as a set state.

Next, a read operation will be described. A bit line and a word line are selected in order to select a memory cell to be read. A read current may be supplied to the selected memory cell to determine whether data stored in the selected memory cell is "1" or "0" based on a voltage change caused by a resistance of the phase-change material GST of the selected memory cell. Thus, the PRAM device may write and read data corresponding to the state of the phase-change material.

Figure 4:
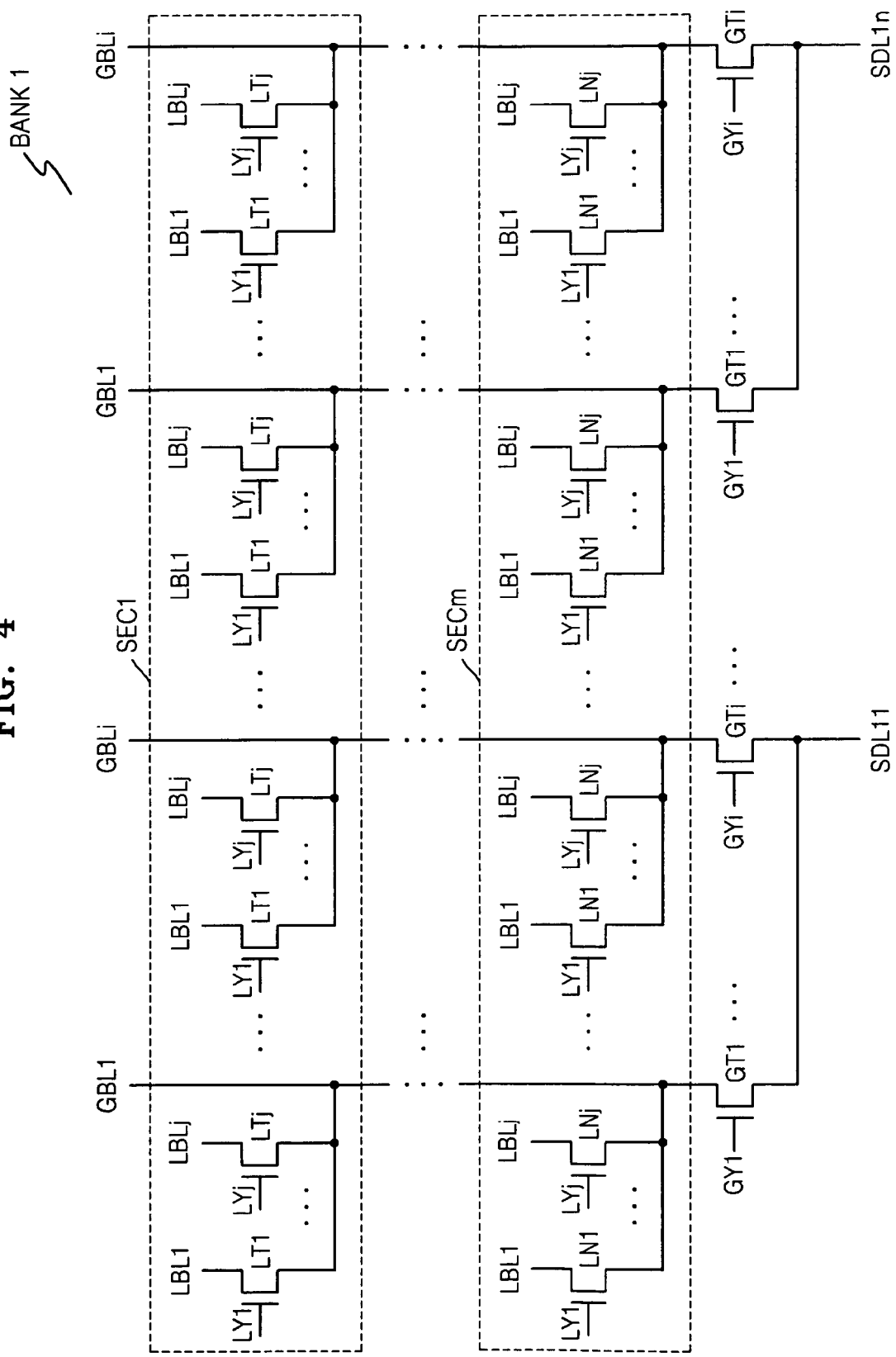
FIG. 4 illustrates a circuit diagram of a memory cell array of a PRAM device.

FIG. 4 illustrates a circuit diagram of a memory cell array of a PRAM device. Although FIG. 4 illustrates only a single bank BANK1, the PRAM device may include a plurality of banks each configured as the bank BANK1 of FIG. 4.

Referring to FIG. 4, the bank BANK1 may include a plurality of sectors SEC1 to SECm, global bit lines GBL11 to GBL1$i$, and local bit lines LBL1 to LBLj. Each of the global bit lines GBL11 to GBL1$i$ may be connected to a plurality of local bit lines LBL1 to LBLj. Each of the global bit lines GBL11 to GBL1$i$ may be connected to a plurality of sectors SEC1 to SECm.

Each of the global bit lines GBL11 to GBL1$i$ may be connected to a corresponding global bit line selection transistor GT1 to GTi, and each of the local bit lines LBL1 to LBLj may be connected to a local bit line selection transistor LT1 to LTj. The global bit line selection transistors GT1 to GTi may respond to global bit line selection signals GY1 to GYi to activate the global bit lines GBL1 to GBLi, respectively. The local bit line selection transistors LT1 to LTj may respond to local bit line selection signals LY1 to LYj to activate the local bit lines LBL1 to LBLj, respectively. Thus, a cell to be written to, or read from, may be selected by turning-on a global bit line transistor and a local bit line transistor corresponding to the cell. Also, a voltage may be applied to a word line (not shown) corresponding to the cell.

Figure 5:
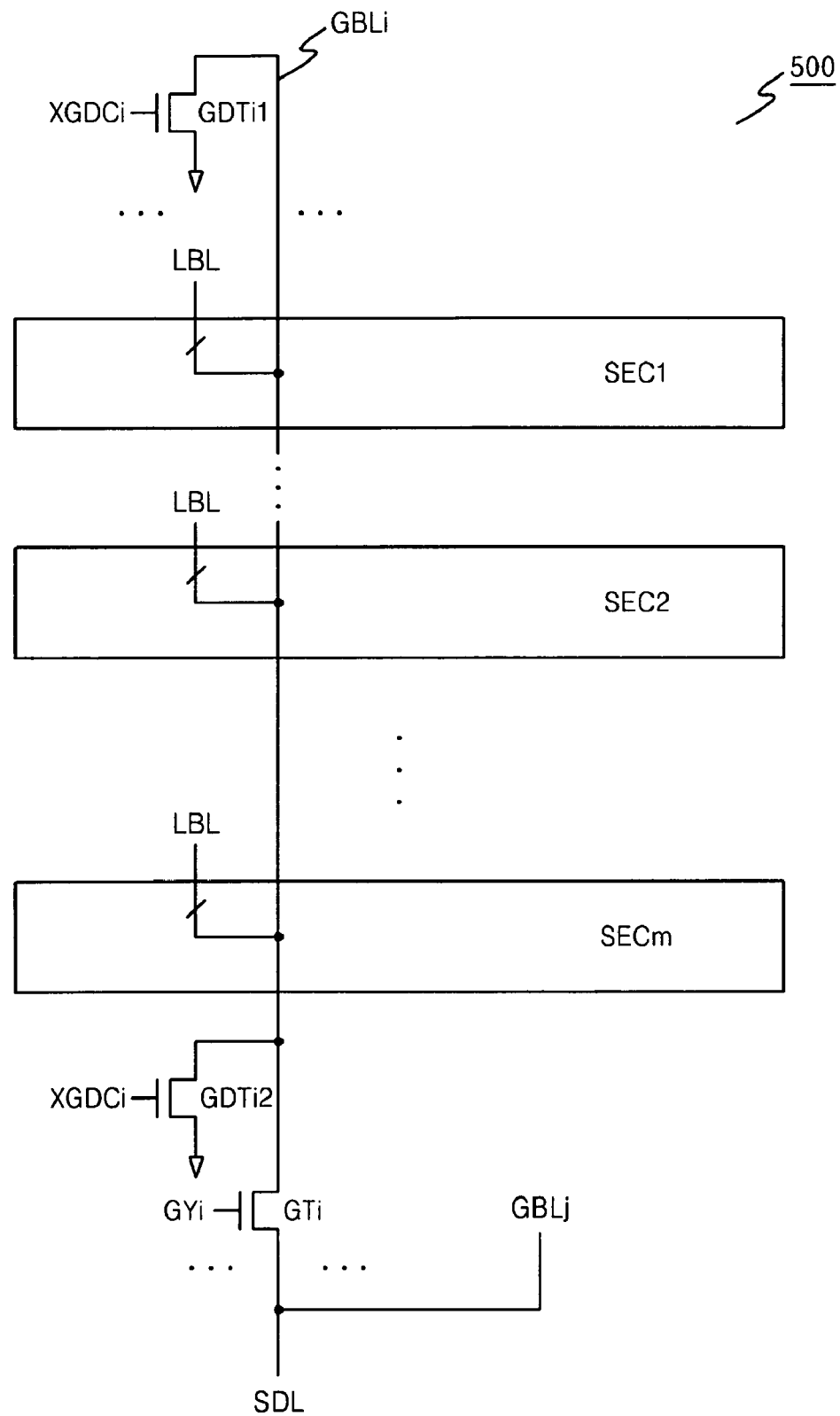
FIG. 5 illustrates a circuit diagram of a PRAM device according to a first embodiment.

As shown in FIG. 5, each of sense amplifier data lines SDL11 to SDL1$n$ may be connected to a plurality of global bit lines GBL11 to GBL1$i$. A single sense amplifier may sense the plurality of global bit lines connected to the corresponding sense amplifier data line. However, when a sense amplifier is implemented so that it senses a single global bit line, a separate sense amplifier data line may not be required.

Each of the local bit lines LBL1 to LBLj may be connected to cells. In particular, a group of cells connected to a local bit line is defined as a "sub cell array." For example, a first sub cell array SCA may be defined as a group of cells connected to local bit lines in a first sector SEC1 among the local bit lines LBL1 to LBLj connected to a first global bit line GBL1 of the first sense amplifier data line SDL11. Thus, each sector may include a plurality of sub cell arrays SCA (see FIG. 10).

Hereinafter, PRAM devices according to embodiments of the present invention will be described in terms of the memory cell arrays (or banks) of FIG. 4. However, the PRAM devices may or may not include a sense amplifier data line. In addition, each of the local bit lines may include a plurality of local bit line selection transistors, which will be described below.

FIG. 5 illustrates a circuit diagram of a PRAM device 500 according to a first embodiment.

Referring to FIG. 5, a global bit line GBLi of the PRAM device 500 may include a plurality of first discharge units, e.g., GDTi1 and GDTi2, which respond to a first discharge signal XGDCi to discharge the global bit line GBLi connected thereto. A $j^{th}$ global bit line GBLj (not shown in FIG. 5) may have the same structure as the $i^{th}$ global bit line GBLi.

In an implementation, the PRAM device 500 may have two first discharge units GDTi1 and GDTi2 for the global bit line GBLi. The two first discharge units GDTi1 and GDTi2 for the global bit line GBL may be disposed at respective ends of the global bit line GBL. In an implementation, GDTi1 and GDTi2 may each include metal oxide semiconductor (MOS) transistors, the gates of which may be controlled by a first discharge signal XGDCi. One end of each MOS transistor may be connected to a ground voltage line. In an implementation, as shown in FIG. 5, the first discharge units may be, or may include, an n-channel MOS (NMOS) transistor.

The PRAM device 500 may further include a global bit line selection transistor GTi for the global bit line GBLi. The global bit line selection transistor GTi may respond to a first selection signal GYi to activate the corresponding global bit line GBLi. In an implementation, as shown in FIG. 5, the global bit line selection transistor GTi may be an NMOS transistor GTi, the gate of which may be controlled by the first selection signal GYi.

The first discharge signal XGDCi may be activated in synchronization with the first selection signal GYi. For example, when the ith global bit line GBLi is activated, a discharge operation for the $i^{th}$ global bit line GBLi may be performed.

Figure 6:
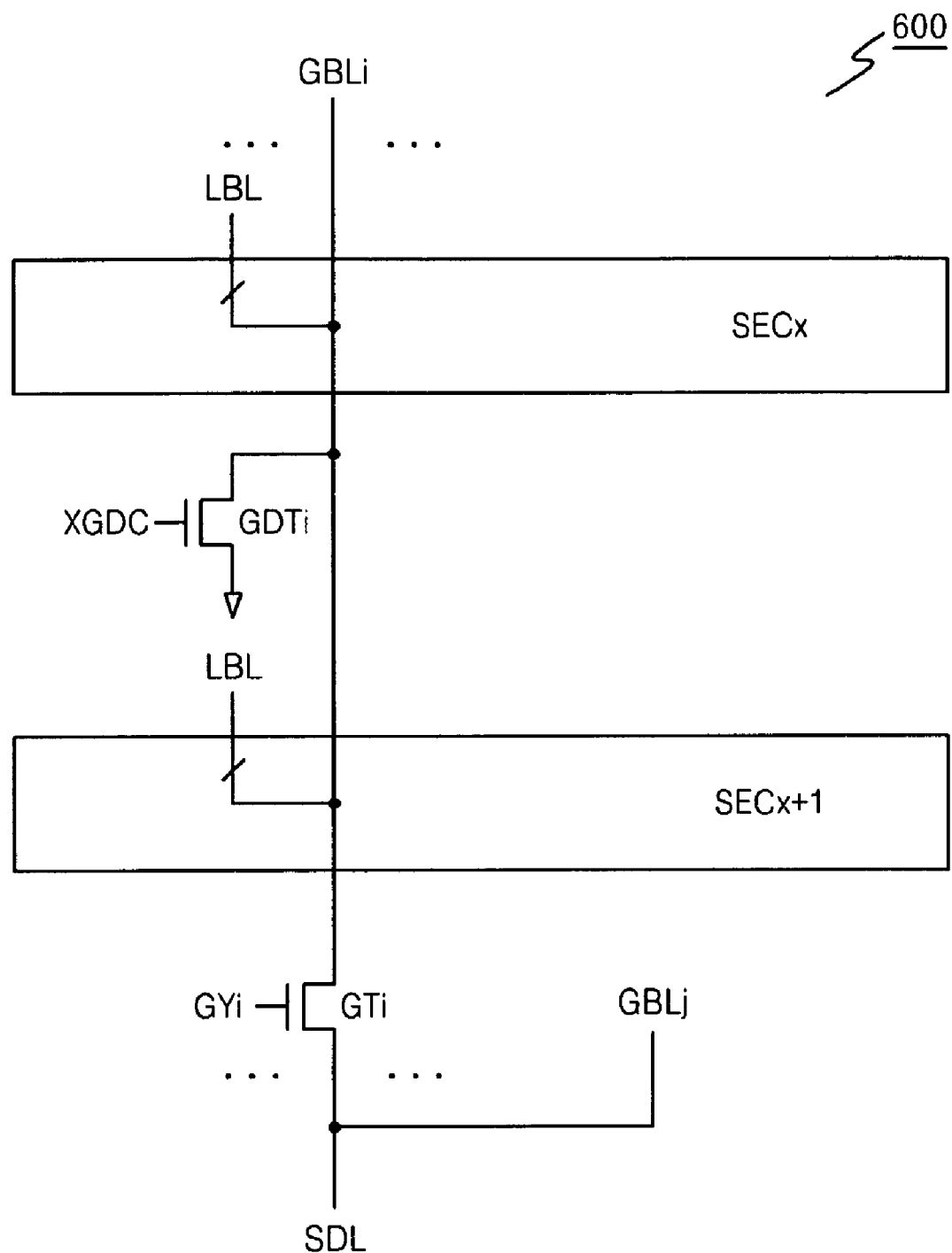
FIG. 6 illustrates a circuit diagram of a PRAM device according to a second embodiment.

FIG. 6 illustrates a circuit diagram of a PRAM device 600 according to a second embodiment.

Referring to FIG. 6, a first discharge unit GDTi of a global bit line GBLi of a PRAM device 600 may be disposed between two sectors. For example, for a plurality of sectors, i.e., a first sector to an $m^{th}$ sector (where m is a positive integer equal to or greater than 2) shared by a plurality of global bit lines GBLi and GBLj, the first discharge unit GDTi may be disposed between an $x^{th}$ sector SECx and a $(x+1)^{th}$ sector SECx+1, wherein x is a positive integer less than m. The first discharge unit GDTi may be, e.g., an NMOS transistor, which may have a gate controlled by the first discharge signal to discharge the corresponding global bit line GBLi in the manner described above in connection with FIG. 5.

The first discharge unit GDTi may be disposed at the center of the global bit lines GBLi. For example, for the case that m is a multiple of 2, the first discharge unit GDTi may be disposed between an $x^{th}$ sector and an $(x+1)^{th}$ sector, wherein x is m/2. In the case that m is not a multiple of 2, the first discharge unit GDTi may be disposed between an $x^{th}$ sector and an $(x+1)^{th}$ sector, wherein x is (m±1)/2.

The operation and structure of the PRAM device 600 of FIG. 6 may be identical or similar to those of the PRAM device 500 of FIG. 5, and thus a detailed description thereof will not be repeated.

Figure 7:
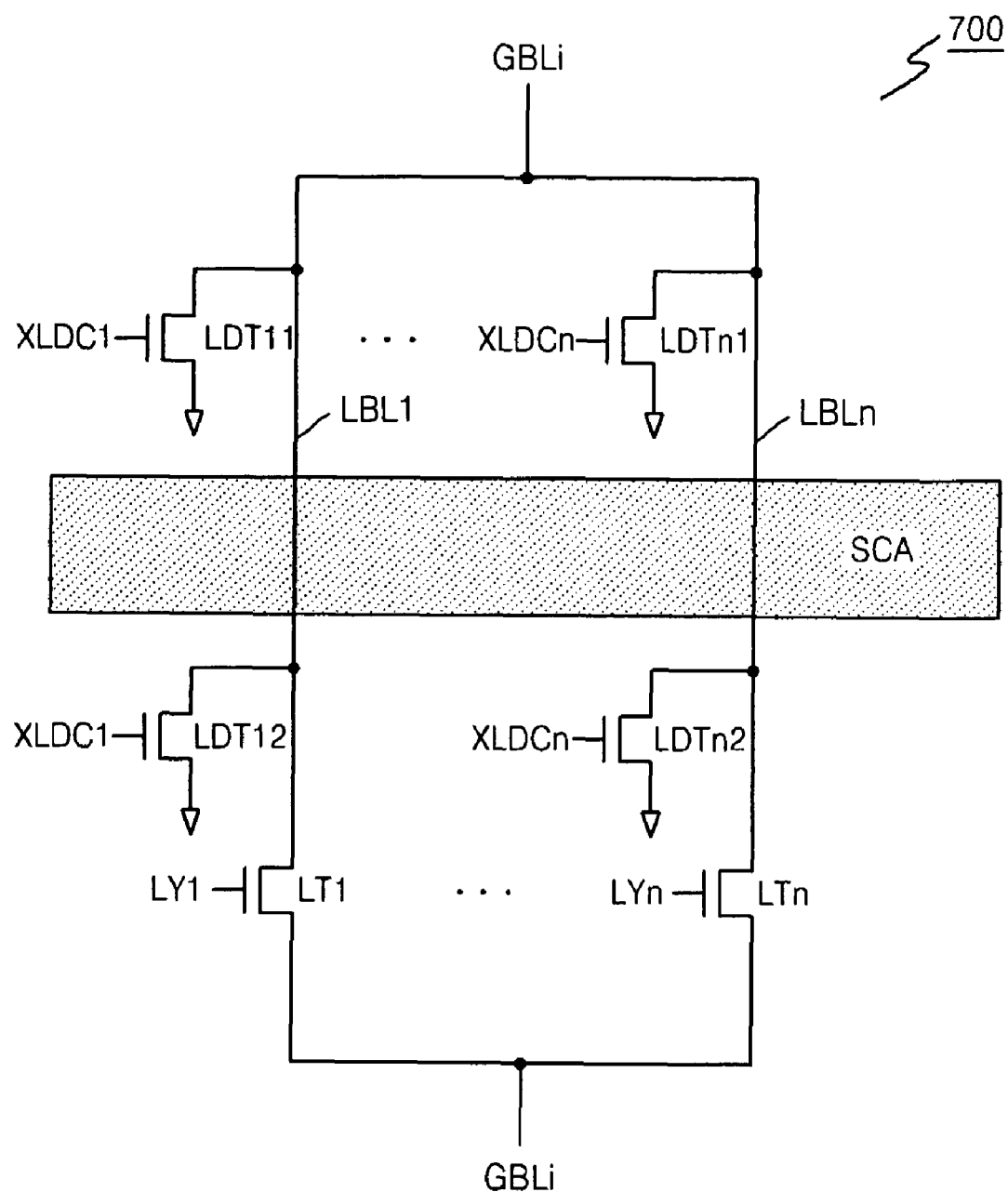
FIGS. 7 and 8 illustrate circuit diagrams of PRAM devices according to a third embodiment.
Figure 8:
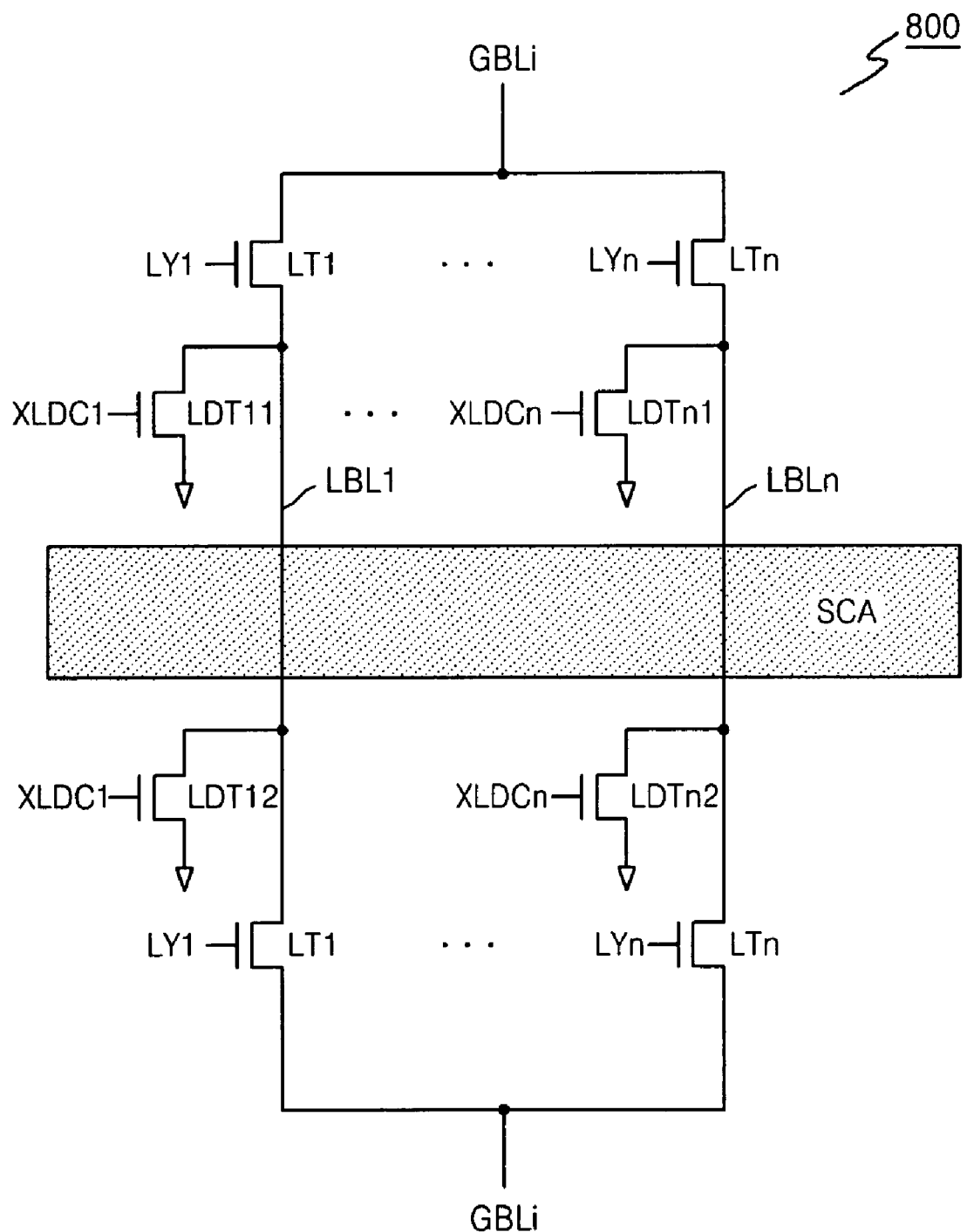

FIGS. 7 and 8 illustrate circuit diagrams of PRAM devices 700 and 800 according to a third embodiment.

Referring to FIGS. 7 and 8, local bit lines LBL1 to LBLn of the PRAM devices 700 and 800 may include a plurality of second discharge units LDT11, LDT12, LDTn1 and LDTn2, which may respond to corresponding second discharge signals XLDC1 to XLDCn to discharge the connected local bit lines LBL1 to LBLn. The PRAM devices 700 and 800 may include two second discharge units for each local bit lines, e.g., at respective ends of the corresponding local bit lines, as shown in FIGS. 7 and 8.

The PRAM devices 700 and 800 may each include a plurality of sub cell arrays SCA. The sub cell arrays SCA may be disposed between second discharge units LDTn1 and LDTn2 on opposite ends of the corresponding local bit lines LBL1 to LBLn, as shown in FIGS. 7 and 8.

The second discharge units LDT11, LDT12, LDTn1 and LDTn2 may each include a MOS transistor, the gate of which may be controlled by corresponding second discharge signals XLDC1 to XLDCn. One end of the MOS transistor may be connected to a ground voltage line. In an implementation, as shown in FIGS. 7 and 8, the second discharge units may be, or may include, NMOS transistors.

The PRAM devices 700 and 800 may further include local bit line selection transistors LT1 to LTn. A respective one of the local bit line selection transistors LT1 to LTn may be formed at one end of the corresponding local bit line LBL1 to LBLn, as shown in the PRAM device 700 of FIG. 7. In another implementation, two local bit line selection transistors LT1 to LTn may be formed, one at each end of the corresponding local bit line LBL1 to LBLn, as shown in the PRAM device 800 of FIG. 8.

The local bit line selection transistors LT1 to LTn may respond to the second selection signal LY1 to LYn to activate the local bit lines LBL1 to LBLn, respectively. The local bit line selection transistors LT1 to LTn may each include, or may be, an NMOS transistor gated by the second selection signal, as shown in FIGS. 7 and 8.

The second discharge signal XLDC1 to XLDCn may be activated in synchronization with the second selection signals LYi to LYn, respectively. For example, when the first local bit line LBL1 is activated, a discharge operation of the first local bit line LBL1 may be performed.

Figure 9:
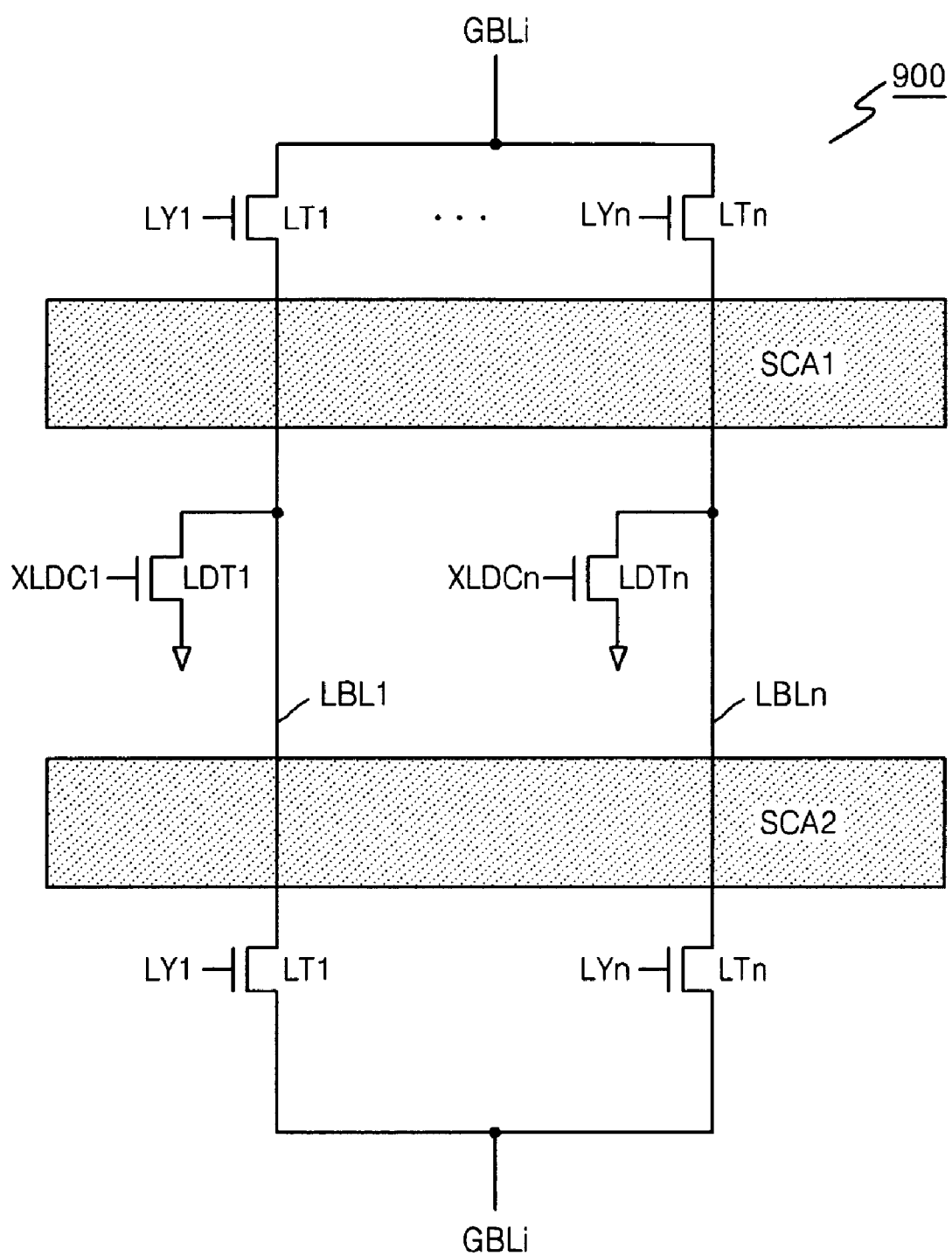
FIG. 9 illustrates a circuit diagram of a PRAM device according to a fourth embodiment.

FIG. 9 illustrates a circuit diagram of a PRAM device 900 according to a fourth embodiment.

Referring to FIG. 9, second discharge unit LDT1 to LDTn of a local bit line LBL1 to LBLn of a PRAM device 900 may be disposed between two sub cell arrays, where a sub cell array is a group of adjacent cells connected to arbitrary local bit lines. For example, for a plurality of sub cell arrays, i.e., a first cell array to an $m^{th}$ cell array, where m is a positive integer equal to or greater than 2, the second discharge units LDT1 to LDTn may be disposed between an $x^{th}$ sub cell array and an $(x+1)^{th}$ sub cell array, wherein x is a positive integer less than m. In FIG. 9, the PRAM device 900 includes two sub cell arrays SCA1 and SCA2, and the second discharge units LDT1 to LDTn are disposed between the first sub cell array SCA1 and the second sub cell array SCA2. In an implementation, the size of the first sub cell array SCA1 and the second sub cell array SCA2 may be ½ the size of the sub cell array of FIGS. 7 and 8.

The operation and structure of the PRAM device 900 of FIG. 9 may be identical or similar to those of the PRAM devices 700 and 800 of FIGS. 7 and 8, and thus descriptions thereof will not be repeated.

Figure 10:
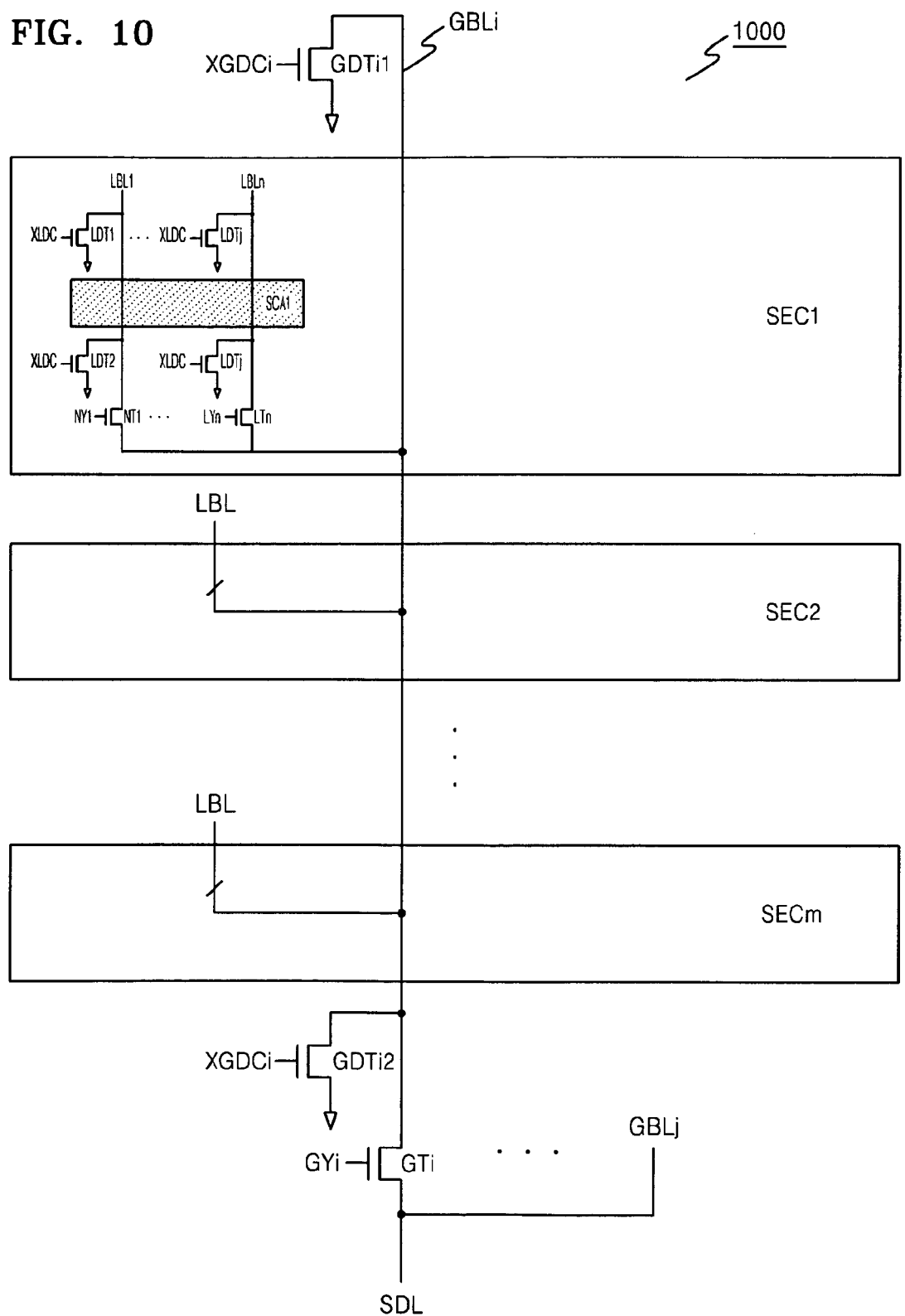
FIG. 10 illustrates a circuit diagram of a PRAM device according to a fifth embodiment.

FIG. 10 illustrates a circuit diagram of a PRAM device 1000 according to a fifth embodiment.

Referring to FIG. 10, global bit lines of the PRAM device 1000, like the global bit lines of FIG. 5 and/or FIG. 6, may include first discharge units at both ends or at the center thereof. In addition, local bit lines of the PRAM device 1000, like the global bit lines of FIG. 5 and/or FIG. 6, may include second discharge units at both ends or at the center thereof.

Figure 11:
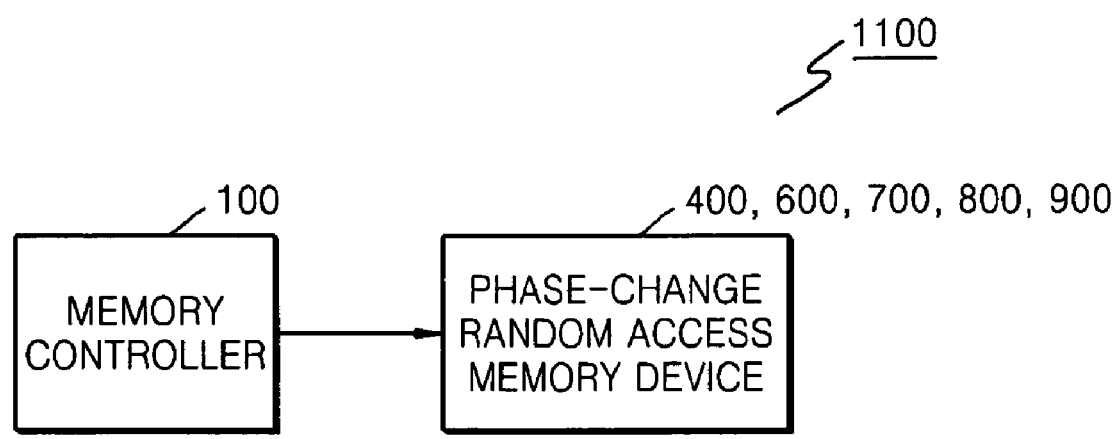
FIG. 11 illustrates a schematic block diagram of a memory system according to embodiments.

FIG. 11 illustrates a schematic block diagram of a memory system 1100 according to embodiments.

Referring to FIG. 11, the memory system 1100 may implement one or more memory devices 500, 600, 700, 800, 900 and 1000 according to embodiments along with a memory controller 100 that controls the PRAM device(s).

As described above, since the PRAM devices according to embodiments may include discharge units, e.g., transistors, at both ends and/or at the center of global bit lines and/or local bit lines, the time required for discharge operations of the bit lines may be reduced, and accurate discharge operations may be performed.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A phase-change random access memory (PRAM) device, comprising:
   a PRAM cell array including a first sector and a second sector;
   a first global bit line coupled to a first local bit line of the first sector and a first local bit line of the second sector; and
   a first plurality of global bit line discharge units coupled to the first global bit line, the first plurality of global bit line discharge units configured to discharge the first global bit line in response to a first global discharge signal, wherein:
   the first plurality of global bit line discharge units includes a first global bit line discharge unit and a second global bit line discharge unit, and
   the first and second sectors are both disposed between the first and second global bit line discharge units.

2. The PRAM device as claimed in claim 1, further comprising:
   a second global bit line coupled to a second local bit line of the first sector and a second local bit line of the second sector; and
   a second plurality of global bit line discharge units coupled to the second global bit line, the second plurality of global bit line discharge units configured to discharge the second global bit line in response to a second global discharge signal.

3. The PRAM device as claimed in claim 1, wherein:
each of the first plurality of global bit line discharge units includes a MOS transistor;
a gate of the MOS transistor is controlled by the first global discharge signal, and
the MOS transistor is configured to couple the first global bit line to a ground voltage line in response to the first global discharge signal.

4. The PRAM device as claimed in claim 1, further comprising a first global bit line selection unit, the first global bit line selection unit configured to activate the first global bit line in response to a first global selection signal.

5. The PRAM device as claimed in claim 4, wherein the first global discharge signal and the first global selection signal are synchronized.

6. The PRAM device as claimed in claim 4, wherein:
the first global bit line selection unit includes a MOS transistor, and
a gate of the MOS transistor is controlled by the first global selection signal.

7. The PRAM device as claimed in claim 1, further comprising:
a first sub cell array in the first sector, the first sub cell array coupled to the first local bit line of the first sector; and
a first local bit line discharge unit coupled to the first local bit line of the first sector, the first local bit line discharge unit configured to discharge the first local bit line of the first sector in response to a first local discharge signal.

8. A phase-change random access memory (PRAM) device, comprising:
a PRAM cell array including a first sector and a second sector;
a first global bit line coupled to a first local bit line of the first sector and a first local bit line of the second sector;
a first plurality of global bit line discharge units coupled to the first global bit line, the first plurality of global bit line discharge units configured to discharge the first global bit line in response to a first global discharge signal;
a first sub cell array in the first sector, the first sub cell array coupled to the first local bit line of the first sector;
a first local bit line discharge unit coupled to the first local bit line of the first sector, the first local bit line discharge unit configured to discharge the first local bit line of the first sector in response to a first local discharge signal; and
a second local discharge unit coupled to the first local bit line of the first sector, the second local discharge unit configured to discharge the first local bit line of the first sector in response to the first local discharge signal, wherein:
the first sub cell array is disposed between the first and second local bit line discharge units.

9. The PRAM device as claimed in claim 7, further comprising:
a second local bit line coupled to the first sub cell array and the first global bit line; and
a second local bit line discharge unit coupled to the second local bit line, the second local bit line discharge unit configured to discharge the second local bit line in response to a second local discharge signal.

10. A phase-change random access memory (PRAM) device, comprising:
a PRAM cell array including a first sector and a second sector;
a first global bit line coupled to a first local bit line of the first sector and a first local bit line of the second sector;
a first plurality of global bit line discharge units coupled to the first global bit line, the first plurality of global bit line discharge units configured to discharge the first global bit line in response to a first global discharge signal;
a first sub cell array in the first sector, the first sub cell array coupled to the first local bit line of the first sector; and
a first local bit line discharge unit coupled to the first local bit line of the first sector, the first local bit line discharge unit configured to discharge the first local bit line of the first sector in response to a first local discharge signal, wherein:
the first sector includes the first sub cell array and a second sub cell array,
a second local bit line of the first sector is coupled to the second sub cell array and the first global bit line,
a second local discharge unit is coupled to the second local bit line of the first sector, the second local discharge unit configured to discharge the second local bit line of the first sector in response to a second local discharge signal, and
the first and second local discharge units are both disposed between the first and second sub cell arrays.

11. The PRAM device as claimed in claim 7, further comprising a first local bit line selection unit, the first local bit line selection unit configured to activate the first local bit line of the first sector in response to a first local selection signal.

12. A phase-change random access memory (PRAM) device, comprising:
a PRAM cell array including a first sector and a second sector;
a first global bit line coupled to a first local bit line of the first sector and a first local bit line of the second sector;
a first plurality of global bit line discharge units coupled to the first global bit line, the first plurality of global bit line discharge units configured to discharge the first global bit line in response to a first global discharge signal;
a first sub cell array in the first sector, the first sub cell array coupled to the first local bit line of the first sector;
a first local bit line discharge unit coupled to the first local bit line of the first sector, the first local bit line discharge unit configured to discharge the first local bit line of the first sector in response to a first local discharge signal;
a first local bit line selection unit, the first local bit line selection unit configured to activate the first local bit line of the first sector in response to a first local selection signal; and
a second local bit line selection unit, the second local bit line selection unit configured to activate the first local bit line of the first sector in response to the first local selection signal, wherein:
the first sub cell array is disposed between the first and second local bit line selection units.

13. The PRAM device as claimed in claim 12, further comprising a second local discharge unit coupled to the first local bit line of the first sector, the second local discharge unit configured to discharge the first local bit line of the first sector in response to the first local discharge signal, wherein:
the first and second local bit line discharge units are disposed between the first and second local bit line selection units.

14. A phase-change random access memory (PRAM) system, comprising:
a PRAM cell array; and
a memory controller configured to control operations of the memory cell array, wherein:

the memory cell array includes:
- a first sector and a second sector,
- a first global bit line is coupled to a first local bit line of the first sector and a first local bit line of the second sector, and
- a first plurality of global bit line discharge units is coupled to the first global bit line, the first plurality of global bit line discharge units configured to discharge the first global bit line in response to a first global discharge signal, the first plurality of global bit line discharge units includes a first global bit line discharge unit and a second global bit line discharge unit, and the first and second sectors are both disposed between the first and second global bit line discharge units.

15. A method of operating a memory system having a phase-change random access memory (PRAM) cell array including a first sector and a second sector, the method comprising:
- controlling set and reset states of cells in the first and second sectors of the PRAM cell array;
- sensing the set and reset states of the cells using a global bit line coupled to a first local bit line of the first sector and a second local bit line of the second sector; and
- using a global discharge signal to control a plurality of global bit line discharge units coupled to the global bit line, wherein:

the plurality of global bit line discharge units includes a first global bit line discharge unit and a second global bit line discharge unit, and the first and second sectors are both disposed between the first and second global bit line discharge units.

* * * * *